United States Patent
Kossives et al.

(10) Patent No.: US 7,091,469 B2
(45) Date of Patent: Aug. 15, 2006

(54) PACKAGING FOR OPTOELECTRONIC DEVICES

(75) Inventors: Dean Paul Kossives, Glen Gardner, NJ (US); Kambhampati Ramakrishna, Chandler, AZ (US); Edward Lap Zak Law, Mission Viejo, CA (US); Diane Sahakian, Tempe, AZ (US); Theodore G. Tessier, Chandler, AZ (US); Jamin Ling, Scottsdale, AZ (US)

(73) Assignee: ST Assembly Test Services Ltd., Singapore (SG)

( * ) Notice: Subject to any disclaimer, the term of this patent is extended or adjusted under 35 U.S.C. 154(b) by 0 days.

(21) Appl. No.: 10/850,934

(22) Filed: May 20, 2004

(65) Prior Publication Data

US 2005/0258216 A1 Nov. 24, 2005

(51) Int. Cl.
*H01L 31/00* (2006.01)
*H01L 31/0232* (2006.01)
*H01L 21/00* (2006.01)

(52) U.S. Cl. .................. 250/214.1; 257/432; 257/433; 438/64; 438/65; 438/127; 348/374

(58) Field of Classification Search ............... 250/216, 250/239, 208.1, 214.1; 257/431–434, 678, 257/737, 738, 780, 787, 680; 438/64, 65, 438/70, 98, 106, 116, 127, 57; 396/529, 396/429, 535, 268; 348/374

See application file for complete search history.

(56) References Cited

U.S. PATENT DOCUMENTS

| | | | |
|---|---|---|---|
| 5,682,066 A * | 10/1997 | Gamota et al. ............. 257/783 |
| 6,320,178 B1 * | 11/2001 | Miller et al. ............ 250/214 R |
| 6,649,991 B1 | 11/2003 | Chen et al. | |
| 6,661,084 B1 * | 12/2003 | Peterson et al. ............ 257/680 |
| 6,787,869 B1 * | 9/2004 | Vittu ........................... 257/434 |
| 6,917,090 B1 * | 7/2005 | Moden ........................ 257/431 |

* cited by examiner

*Primary Examiner*—Stephone B. Allen
*Assistant Examiner*—Davienne Monbleau
(74) *Attorney, Agent, or Firm*—Mikio Ishimaru

(57) ABSTRACT

An optoelectronic sensor is attached to an optically transparent substrate, such as glass, and encapsulated to form an optoelectronic device. An optical assembly can be mounted opposite the optoelectronic sensor. Filters and refractive index matching materials may be included between the optoelectronic sensor and the optically transparent substrate.

20 Claims, 3 Drawing Sheets

PACKAGING FOR OPTOELECTRONIC DEVICES

TECHNICAL FIELD

The present invention relates generally to optoelectronic devices and more particularly to a method and apparatus for packaging optoelectronic devices.

BACKGROUND ART

Numerous electronic devices, such as digital cameras, personal digital assistants, and internet appliances, utilize optoelectronic sensors. Optoelectronic sensors are semiconductor chips that are capable of electronically capturing visual information by converting light to electronic signals so that this information can be processed or viewed electronically. Optoelectronic devices, such as image sensors, charge coupled devices (CCDs), or other light sensitive sensors, require the sensors to have a "line of sight" through the package housing the optoelectronic sensors.

A conventional optoelectronic device usually encapsulates a semiconductor chip onto which the sensor is mounted in a package with a non-transparent molded resin or ceramic material, which prevents the encapsulated semiconductor chip from chemical or physical reaction with the external atmosphere as well as providing mechanical protection to avoid damage to the semiconductor chip from external sources. Typical packages include plastic or ceramic leaded or leadless packages, ball grid array (BGA) packages, and dual in line packages (DIP). However, for optoelectronic devices, the structure of the package for the device regardless of the type of package includes a glass cover mounted on the package so the optoelectronic sensor mounted in the package is capable of detecting light passing into the device through the glass cover.

Conventional packages for optoelectronic devices therefore consist of two pieces, a carrier substrate for the optoelectronic sensor and the glass cover to allow light to reach the optoelectronic sensor after encapsulation of the carrier substrate by either plastic or ceramic material.

Using conventional semiconductor device packaging with glass covers has several disadvantages. For example, the glass covers can separate from the plastic or ceramic packaging material resulting in the optoelectronic sensor being exposed to the external environment thereby eventually destroying the device.

Another problem is that moisture can enter the package causing condensation on the inside of the glass cover thus degrading the image capturing ability and quality of the device.

Additionally, the finished package consists of two pieces requiring the device to pass through the normal semiconductor wire bonding process, a cleaning process, and an assembly process to install the glass cover making the production cost of the conventional device high as well as requiring extra processing steps.

Therefore, there is need for a package for optoelectronic devices having a single piece construction with improved moisture resistance, lower cost, and higher reliability.

Solutions to these problems have been long sought but prior developments have not taught or suggested any solutions and, thus, solutions to these problems have long eluded those skilled in the art.

DISCLOSURE OF THE INVENTION

The present invention provides an optoelectronic device and method of packaging. An optoelectronic sensor is attached to an optically transparent substrate and encapsulated to form the optoelectronic device.

The package for optoelectronic devices has a single piece construction with improved moisture resistance, lower cost, and higher reliability.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations and process steps are not disclosed in detail.

Likewise, the drawings showing embodiments of the device are semi-diagrammatic and not to scale and, particularly, some of the dimensions are for the clarity of presentation and are shown greatly exaggerated in the FIGS.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Figure 1:
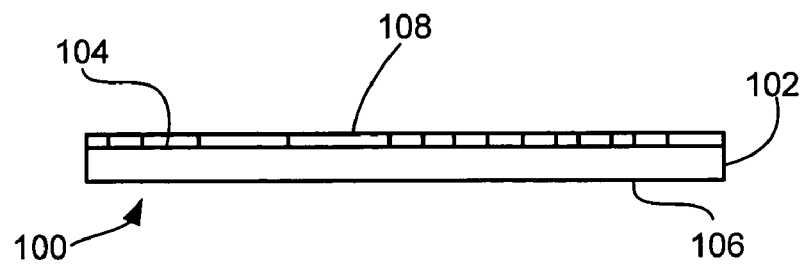
FIG. 1 is a partial cross-sectional view of an optoelectronic device at an intermediate stage of manufacture in accordance with the present invention.

Referring now to FIG. 1 therein is shown a partial cross-sectional view of an optoelectronic device 100 at an intermediate stage of manufacture in accordance with the present invention. The optoelectronic device 100 includes an optically transparent substrate 102 having a first surface 104 and a second surface 106.

The type of optically transparent substrate 102 depends upon the particular application for the optoelectronic device 100. Generally, the optically transparent substrate preferably has a high degree of planarity. Additionally, a variety of coatings, for example, which block infra red or other unwanted wavelengths, can be applied to the optically transparent substrate 102. The coatings are application specific. For example, a night vision camera that captures thermal images needs light from the infra red range of the spectrum, but a digital camera for normal use generally has light from the infrared spectrum blocked by a suitable coating on the optically transparent substrate 102. Anti reflective coatings can provide additional benefits in specific applications, and those coatings can be deposited on the optically transparent surface 102 at an economical and practical point in the manufacturing process.

Coatings can be applied in a variety of ways, such as by deposition, for example chemical vapor deposition (CVD) or plasma enhanced chemical vapor deposition (PECVD), etching, growing, plating, evaporating, sputtering, or other process to apply the necessary antireflective, wavelength selective, wavelength cut off, or other desired coating.

The first surface 104 and the second surface 106 are horizontal and preferably, substantially parallel to each other. A metallization layer 108 is formed on the first surface 104 by depositing and processing a pattern of metal interconnect on the first surface 104 using standard semiconductor processing techniques. It also has been discovered that processes used to manufacture flat panel displays also may be used in commercial production. The optically transparent substrate 102 can be large enough to provide a number of package sites that are subsequently separated, such as by a dicing operation.

Figure 2:
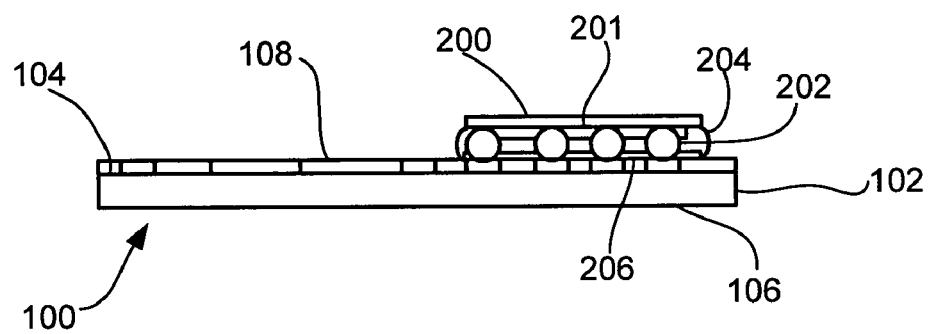
FIG. 2 is the structure of FIG. 1 after connecting an optoelectronic sensor to an optically transparent substrate.

Referring now to FIG. 2 therein is shown the structure of FIG. 1 after connecting an optoelectronic sensor 200 to the metallization layer 108 on the first surface 104 of the optically transparent substrate 102. The optoelectronic sensor 200 is attached to the metallization layer 108 using balls 202 to attach the optoelectronic sensor 200 to the first surface 104 of the optically transparent substrate 102. The optoelectronic sensor 200 can be attached by soldering the optoelectronic sensor 200 to the metallization layer 108. Preferably, the soldering uses balls of a material selected from the group comprising solder, gold, platinum, nickel, copper, a metal belonging to Group 1B of the periodic chart of elements, a metal from the transition metal groups, an alloy thereof, a mixture thereof, solder wettable alloys thereof, and a combination thereof. The material selected for the balls can be soldered directly, combined with solder, positioned on pre-soldered pads and reflowed with the aid of liquid flux, or reflowed in a reducing gas atmosphere such as hydrogen, carbon monoxide, nitrogen, or formic acid vapor.

It has been discovered that the connection of the optoelectronic sensor 200 to the first surface 104 of the optically transparent substrate 102 can be controlled to a very high degree by a number of die attach processes used in semiconductor manufacturing. Consequently, the optoelectronic sensor 200 is substantially coplanar with the first surface 104 and the second surface 106 of the optically transparent substrate 102.

The optoelectronic sensor 200 is an integrated circuit onto which is mounted a light sensitive sensor 201. The optoelectronic sensor 200 is positioned on metallization layer 108 so the light sensitive sensor 201 can detect light passing through the optically transparent substrate 102 in the area of the optoelectronic sensor 200. Accordingly, the area of the optically transparent substrate 102 over which the optoelectronic sensor 200 is positioned has no metallization layer 108, routing or passivation layers thereby allowing light to reach the optoelectronic sensor 200 through the optically transparent substrate 102. If necessary or desirable, a filter 206, such as a filter selected from the group of selected from the group of infrared, ultraviolet, color, and combinations thereof can be formed over the optically transparent substrate 102 in the area of the optoelectronic sensor 200. For example, an infrared blocking layer can be formed over the optically transparent substrate 102.

The space between the optoelectronic sensor 200 and the optically transparent substrate 102 can be filled with an appropriate sealant 204 of at least one of a refractive index matching material, such as a refractive index matching gel, an edge sealing material, and a combination therof. The edge sealing material can be formed between the edge of the optoelectronic sensor 200 and the first surface 104 of the optically transparent substrate 102 while maintaining the space between the optoelectronic sensor 200 and the first surface 104 of the optically transparent substrate 102. Thus, the refractive index in the space can be matched with the refractive index of the optically transparent substrate 102 if it is necessary or desirable for a particular application.

Figure 3:
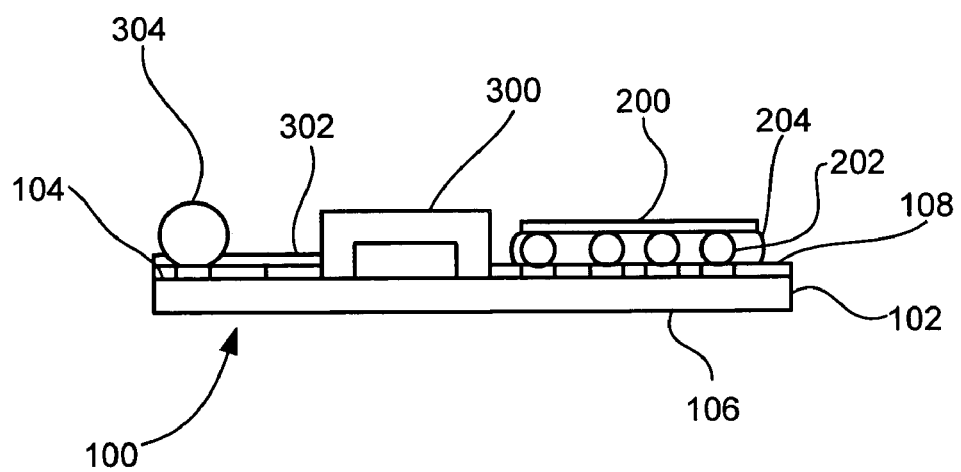
FIG. 3 is the structure of FIG. 2 after connecting other devices and secondary connections to the optically transparent substrate.

Referring now to FIG. 3 therein is shown the structure of FIG. 2 after connecting a device 300 and forming a number of secondary connections 304 to the optically transparent substrate 102. The device 300 is representative of any number of other devices and may comprise passive components, transistors, logic, memory, other sensors, or other elements to be included in the optoelectronic device 100. A second metallization layer 302 may be used to connect the device 300 and the secondary connections 304. The first metallization layer 108, the secondary connections 304 as well as the second metallization layer 302 may be formed before or after attachment of the optoelectronic sensor 200.

Figure 4:
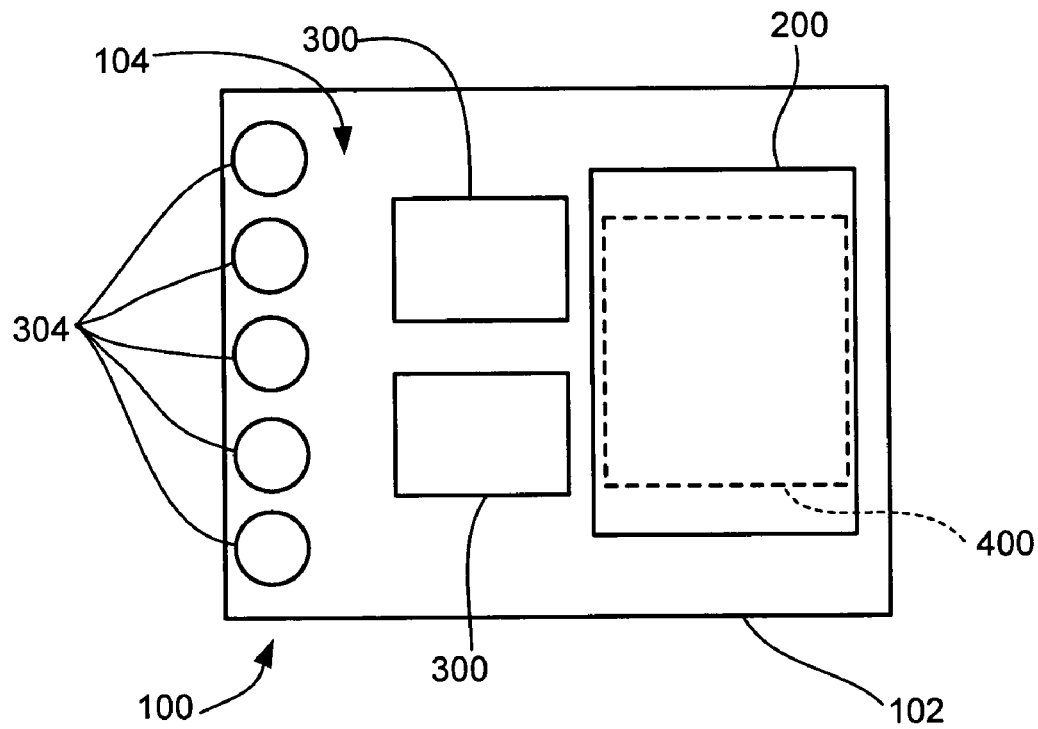
FIG. 4 is a plan view of the structure of FIG. 3.

Referring now to FIG. 4 therein is shown a plan view of the structure of FIG. 3. The optically transparent substrate 102 has the optoelectronic sensor 200 positioned over an area 400 of the optically transparent substrate 102 through which light can reach the optoelectronic sensor 200. The optically transparent substrate 102 also has positioned thereon the other devices 300 and the secondary connections 304.

Figure 5:
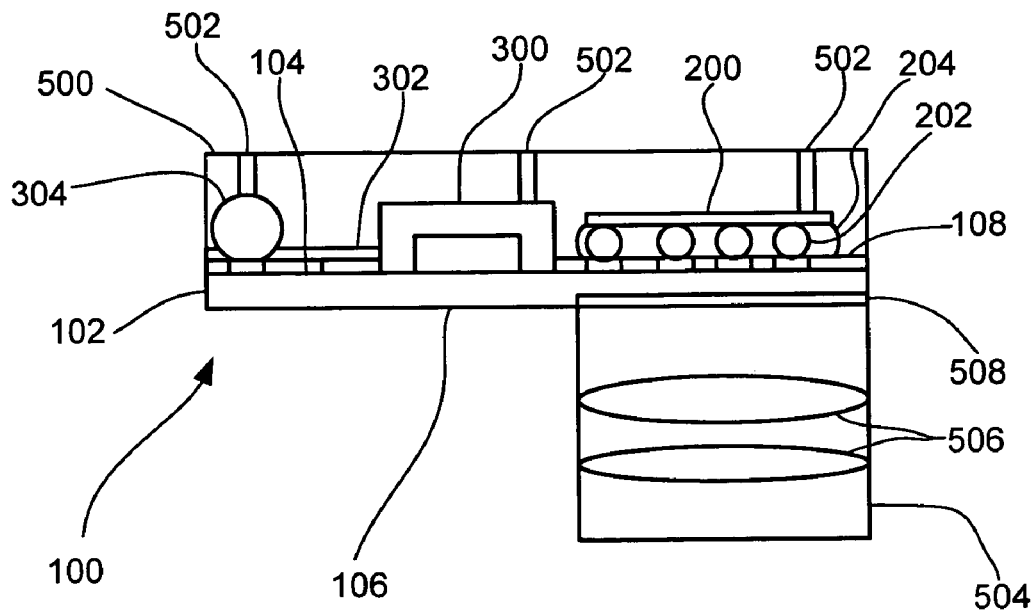
FIG. 5 is the structure of FIG. 3 after encapsulation of the optoelectronic sensor.

Referring now to FIG. 5 therein is shown the structure of FIG. 3 after encapsulation of the optoelectronic device 100. The optoelectronic device 100 is encapsulated by forming, such as by molding, a resin or other suitable encapsulant 500 over the optically transparent substrate 102 thereby sealing the optoelectronic sensor 200, the other devices 300, and the secondary connections 304. A number of contacts 502 are formed through the encapsulant 500 operatively connected to the optoelectronic sensor 200, the other devices 300, the secondary connections 304, or to other portions of the optoelectronic device 100 as may be necessary.

An optical assembly 504 is positioned on the second surface 106 of the optically transparent substrate 102 opposite the optoelectronic sensor 200. The optical assembly 504 may include a number of optical lenses 506 to focus light on the optoelectronic sensor 200, or other optical components depending upon the specific application involved. The second surface 106 of the optically transparent substrate 102 preferably has a receptacle 508 in the second surface 106 of the optically transparent substrate 102 to facilitate positioning of the optical assembly 504 in the correct position opposite the optoelectronic sensor 200. The receptacle 508 can be formed in any suitable manner such as by etching the second surface 106 of the optically transparent substrate 102.

It has been discovered that because of the high degree of planarity that can be maintained between the optoelectronic sensor 200, the first surface 104, and the second surface 106 of the optically transparent substrate 102 higher tolerances can be achieved. Conventional packages often have variations where bonding thicknesses and tilt of the optoelectronic sensor 200 can vary by upwards of 50 microns. The present invention results in tolerances less than about 50 microns. Consequently, the method and apparatus of the present invention provides a simple yet accurate and economical mounting of the optical assembly 504 to the second surface 106 of the optically transparent substrate 102.

Figure 6:
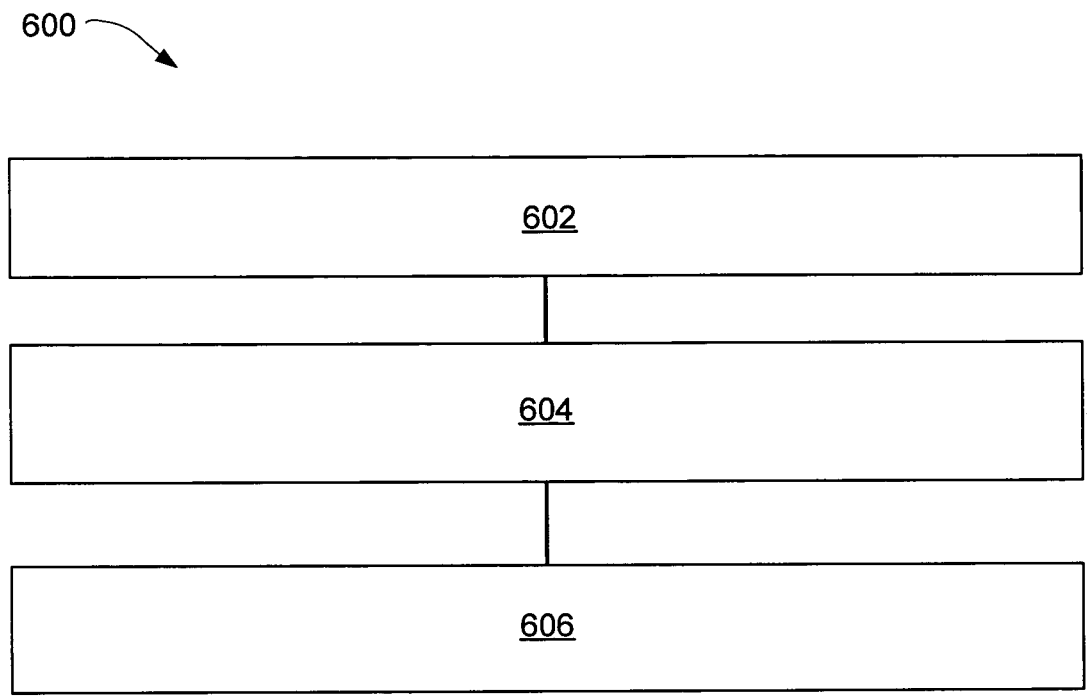
FIG. 6 is a flow chart of a method for manufacturing an optoelectronic device in accordance with the present invention.

Referring now to FIG. 6 therein is shown a flow chart of a method 600 for manufacturing an optoelectronic device 100 in accordance with the present invention. The method 600 includes providing an optically transparent substrate in a block 602; attaching an optical sensor to the optically transparent substrate in a block 604; and encapsulating the optical sensor in a block 606.

Thus, it has been discovered that the method and apparatus of the present invention furnish important and heretofore unavailable solutions, capabilities, and functional advantages for manufacturing an optoelectronic device. The resulting process and configurations are straightforward, economical, uncomplicated, highly versatile, and effective, use conventional technologies, and are thus readily suited for manufacturing devices that are fully compatible with conventional manufacturing processes and technologies.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations, which fall within the scope of the included claims. All matters set forth herein or shown in the accompanying drawings are to be interpreted in an illustrative and non-limiting sense.

The invention claimed is:

1. An optoelectronic device comprising:
    an optically transparent substrate having a first surface and a second surface substantially parallel to the first surface;
    an optical sensor attached to the first surface of the optically transparent substrate;
    a receptacle in the second surface opposite the position of the optical sensor;
    an optical assembly in the receptacle; and
    an encapsulant enclosing the optical sensor.

2. The optoelectronic device as claimed in claim 1 wherein the optical sensor is attached using balls of a material selected from the group of solder, gold, platinum, nickel, copper, a metal belonging to Group 1B of the periodic chart of elements, a metal from the transition metal groups, an alloy thereof, a mixture thereof, solder wettable alloys thereof, and a combination thereof.

3. The optoelectronic device as claimed in claim 1 further comprising:
    other devices attached to the optically transparent substrate selected from the group of passive components, transistors, logic, memory, additional optical sensors, and combinations thereof.

4. The optoelectronic device as claimed in claim 1 further comprising:
    a filter selected from the group of infrared, ultraviolet, color, and combinations thereof between the optical sensor and the optically transparent substrate.

5. The optoelectronic device as claimed in claim 1 wherein the optical sensor is attached in spaced relationship with the optically transparent substrate to form a space there between; and further comprising:
    at least one of a refractive index matching gel, an edge sealant, and combinations thereof in the space.

6. An optoelectronic device comprising:
    a glass substrate having a first surface and a second surface substantially parallel to the first surface;
    an optical sensor attached to the glass substrate;
    a receptacle in the second surface opposite the position of the optical sensor;
    an optical assembly in the receptacle; and
    an encapsulant enclosing the optical sensor.

7. The optoelectronic device as claimed in claim 6 wherein the optical sensor is attached using balls of a material selected from the group of solder, gold, platinum, nickel, copper, a metal belonging to Group 1B of the periodic chart of elements, a metal from the transition metal groups, an alloy thereof, a mixture thereof, solder wettable alloys thereof, and a combination thereof.

8. The optoelectronic device as claimed in claim 6 further comprising:
    other devices attached to the glass substrate selected from the group of passive components, transistors, logic, memory, additional optical sensors, and combinations thereof.

9. The optoelectronic device as claimed in claim 6 further comprising:
    a filter selected from the group of infrared, ultraviolet, color, and combinations thereof positioned between the optical sensor and the glass substrate.

10. The optoelectronic device as claimed in claim 6 wherein the optical sensor is attached in spaced relationship with the glass substrate to form a space; and further comprising;
    at least one of a refractive index matching gel, an edge sealant, and combinations thereof in the space.

11. A method of packaging an optoelectronic device comprising:
    providing an optically transparent substrate having a first surface and a second surface substantially parallel to the first surface;
    attaching an optical sensor to the first surface of the optically transparent substrate;
    forming a receptacle in the second surface opposite the position of the optical sensor;
    attaching an optical assembly in the receptacle; and
    encapsulating the optical sensor.

12. The method of packaging an optoelectronic device as claimed in claim 11 wherein attaching an optical sensor uses balls of a material selected from the group of solder, gold, platinum, nickel, copper, a metal belonging to Group 1B of the periodic chart of elements, a metal from the transition metal groups, an alloy thereof, a mixture thereof, solder wettable alloys thereof, and a combination thereof.

13. The method of packaging an optoelectronic device as claimed in claim 11 further comprising:
    attaching other devices to the optically transparent substrate selected from the group of passive components, transistors, logic, memory, additional optical sensors, and combinations thereof.

14. The method of packaging an optoelectronic device as claimed in claim 11 further comprising:
    attaching a filter selected from the group of infrared, ultraviolet, color, and combinations thereof between the optical sensor and the optically transparent substrate.

15. The method of packaging an optoelectronic device as claimed in claim 11 wherein:

attaching the optical sensor attaches the optical sensor in spaced relationship with the optically transparent substrate to form a space; and further comprising:

enclosing the space using at least one of a refractive index matching gel, an edge sealant, and combinations thereof.

16. A method of packaging an optoelectronic device comprising:

providing a glass substrate having a first surface and a second surface substantially parallel to the first surface;

attaching an optical sensor to the first surface of the glass substrate;

forming a receptacle in the second surface opposite the position of the optical sensor;

attaching an optical assembly in the receptacle; and encapsulating the optical sensor.

17. The method of packaging an optoelectronic device as claimed in claim 16 wherein attaching an optical sensor uses balls of a material selected from the group of solder, gold, platinum, nickel, copper, a metal belonging to Group 1B of the periodic chart of elements, a metal from the transition metal groups, an alloy thereof, a mixture thereof, solder wettable alloys thereof, and a combination thereof.

18. The method of packaging an optoelectronic device as claimed in claim 16 further comprising:

attaching other devices to the glass substrate selected from the group of passive components, transistors, logic, memory, additional optical sensors, and combinations thereof.

19. The method of packaging an optoelectronic device as claimed in claim 16 further comprising:

attaching a filter selected from the group of infrared, ultraviolet, color, and combinations thereof between the optical sensor and the glass substrate.

20. The method of packaging an optoelectronic device as claimed in claim 16 wherein attaching the optical sensor attaches the optical sensor in spaced relationship with the glass substrate to form a space; and further comprising;

enclosing the space using at least one of filling the space with a refractive index matching gel, an edge sealant, and combinations thereof.

* * * * *